(12) United States Patent
Bretthauer et al.

(10) Patent No.: US 12,507,018 B2
(45) Date of Patent: Dec. 23, 2025

(54) PIEZOELECTRIC TRANSDUCER

(71) Applicant: Infineon Technologies AG, Neubiberg (DE)

(72) Inventors: Christian Bretthauer, Munich (DE);
Gabriele Bosetti, Munich (DE);
Andreas Bogner, Munich (DE)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 18/303,269

(22) Filed: Apr. 19, 2023

(65) Prior Publication Data

US 2023/0362551 A1   Nov. 9, 2023

(30) Foreign Application Priority Data

May 6, 2022   (EP) .................................... 22172108

(51) Int. Cl.
*H04R 17/02* (2006.01)
*H04R 7/10* (2006.01)
*H04R 7/18* (2006.01)

(52) U.S. Cl.
CPC .............. *H04R 17/02* (2013.01); *H04R 7/10* (2013.01); *H04R 7/18* (2013.01)

(58) Field of Classification Search
CPC ...... H04R 17/00; H04R 17/02; H04R 17/025; H04R 7/10; H04R 7/06; H04R 17/122; H04R 2201/003; H04R 19/005; B81B 2201/0257

USPC ........ 381/423, 162, 332; 181/157, 168, 171; 310/311

See application file for complete search history.

(56) References Cited

U.S. PATENT DOCUMENTS

| 5,251,188 A | 10/1993 | Parsons et al. | |
| 6,028,389 A * | 2/2000 | Bernstein | H04R 17/00 |
| | | | 310/311 |
| 2007/0023229 A1* | 2/2007 | Yang | H04R 7/06 |
| | | | 181/173 |
| 2007/0047757 A1 | 3/2007 | Yang et al. | |
| 2012/0057728 A1* | 3/2012 | Fujise | H04R 7/06 |
| | | | 381/162 |
| 2016/0219374 A1 | 7/2016 | Hall et al. | |

FOREIGN PATENT DOCUMENTS

| CN | 206341407 U | 7/2017 |
| CN | 212850998 U | 3/2021 |

* cited by examiner

*Primary Examiner* — Sunita Joshi
(74) *Attorney, Agent, or Firm* — Slater Matsil, LLP (57) ABSTRACT

A piezoelectric transducer comprises a deflectable structure having a first portion and a laterally adjoining second portion. The first portion has a piezoelectric layer and the second portion has an insulating material layer, and the second portion has a higher rigidity and a smaller mass per unit area than the first portion.

20 Claims, 7 Drawing Sheets

PIEZOELECTRIC TRANSDUCER

This application claims the benefit of European Patent Application No. 22172108, filed on May 6, 2022, which application is hereby incorporated herein by reference.

TECHNICAL FIELD

Embodiments of the present disclosure relate to a piezoelectric transducer. In particular, embodiments relate to a stiff but lightweight mechanical construction for usage in piezoelectric MEMS transducers for achieving an improved bandwidth of the transducer.

BACKGROUND

The sensing of environmental parameters in the ambient atmosphere, such as noise, sound, pressure, etc., as well as the monitoring of the direct environmental of a mobile device gets more and more attention and importance in the implementation of appropriate sensors within mobile devices.

In the field of piezoelectric MEMS transducers, the frequency behavior of such transducers is essential for the resulting bandwidth and, thus, for the possible field of application of such transducers.

Therefore, there is a need in the field of piezoelectric transducers for increasing the sensitivity and also improving the frequency behavior with an appropriate bandwidth of piezoelectric transducers.

Such a need can be solved by the piezoelectric transducer according to independent claim 1. Further, specific implementations of the piezoelectric transducer are defined in the dependent claims.

SUMMARY

A piezoelectric transducer comprises a deflectable structure having a first portion and a laterally adjoining second portion, wherein the first portion has a piezoelectric layer and the second portion has an insulating material layer, and wherein the second portion is arranged to have a higher rigidity and a smaller mass per unit area than the first portion.

The deflectable structure may comprise a deflectable membrane structure which extends from a clamped border region to a center point of the deflectable membrane structure, and wherein the first portion adjoins the clamped border region and the second region is arranged between the first region and the center point.

Alternatively, the deflectable structure may comprise a deflectable cantilevered structure which extends from a clamped border region to an end region of the deflectable cantilevered structure, and wherein the first portion adjoins the clamped border region and the second region is arranged between the first region and the end region of the deflectable cantilevered structure.

According to embodiments, the specific arrangement of the piezoelectric transducer allows to lower the weight of the deflectable membrane or cantilever structure while maintaining the necessary mechanical stiffness and robustness by light weight layer stacks that may be (optionally) combined with additional ridge structures that have a low area coverage and thus do not have any significant impact on the final weight of the mechanical structure. The present concept is especially applicable to piezoelectric MEMS transducers exploiting a corrugated piezoelectric transduction area, e.g. a corrugated piezoelectric microphone, as this is an additional measure to keep the MEMS at low weight and high resonance frequency. The present concept is also applicable for cantilever structures, e.g. based on bending beams.

To summarize, the present embodiments provide a measure to reduce the weight of a transducer membrane, e.g. a corrugated piezoelectric microphone transducer membrane, in areas that are not generating signal by themselves but contribute by transferring mechanical energy into areas of signal generation (buckled or bended membrane areas). Based on this measure, the weight of the membrane structure can be reduced in order to allow for higher compliance without lowering the resonance frequency, e.g. below 20 kHz.

BRIEF DESCRIPTION OF THE DRAWINGS

In the following, embodiments of the present disclosure are described in more detail with respect to the figures, in which:

FIG. 2b shows a schematic (partial) cross-sectional view of a portion of the piezoelectric transducer of FIG. 2a;

FIG. 3b shows a schematic cross-sectional view of a portion of the piezoelectric transducer of FIG. 3a;

FIG. 4b shows a schematic cross-sectional view of a portion of the piezoelectric transducer of FIG. 4a;

FIG. 5a shows a schematic cross-sectional view of a piezoelectric transducer according to a further embodiment;

FIG. 5b shows a schematic plain view of the piezoelectric transducer of FIG. 5a;

FIG. 6a shows a schematic cross-sectional view of a piezoelectric transducer according to a further embodiment; and FIG. 6b shows a schematic plain view of the piezoelectric transducer of FIG. 6a.

With respect to the figures, it is pointed out that the drawings are only schematic views and are not (necessarily) drawn to scale.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following description, embodiments are discussed in detail, however, it should be appreciated that the embodiments provide many applicable concepts that can be embodied in a wide variety of semiconductor devices. The specific embodiments discussed are merely illustrative of specific ways to make and use the present concept, and do not limit the scope of the embodiments. In the following description of embodiments, the same or similar elements having the same function have associated therewith the same reference signs or the same name, and a description of such elements will not be repeated for every embodiment. Moreover, features of the different embodiments described hereinafter may be combined with each other, unless specifically noted otherwise.

In the description of the embodiments, terms and text passages placed in brackets are to be understood as further exemplarily explanations, configurations, additions and/or alternatives.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some of the figures comprise a Cartesian coordinate system x, y, z, wherein the x-y-plane corresponds, i.e. is parallel, to a reference plane (=x-y-plane), e.g. a main surface region of a membrane structure (in an undeflected condition), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction or a direction parallel to (or in) the x-y-plane, wherein the term "vertical" means a direction parallel to the z-direction.

Figure 1A:
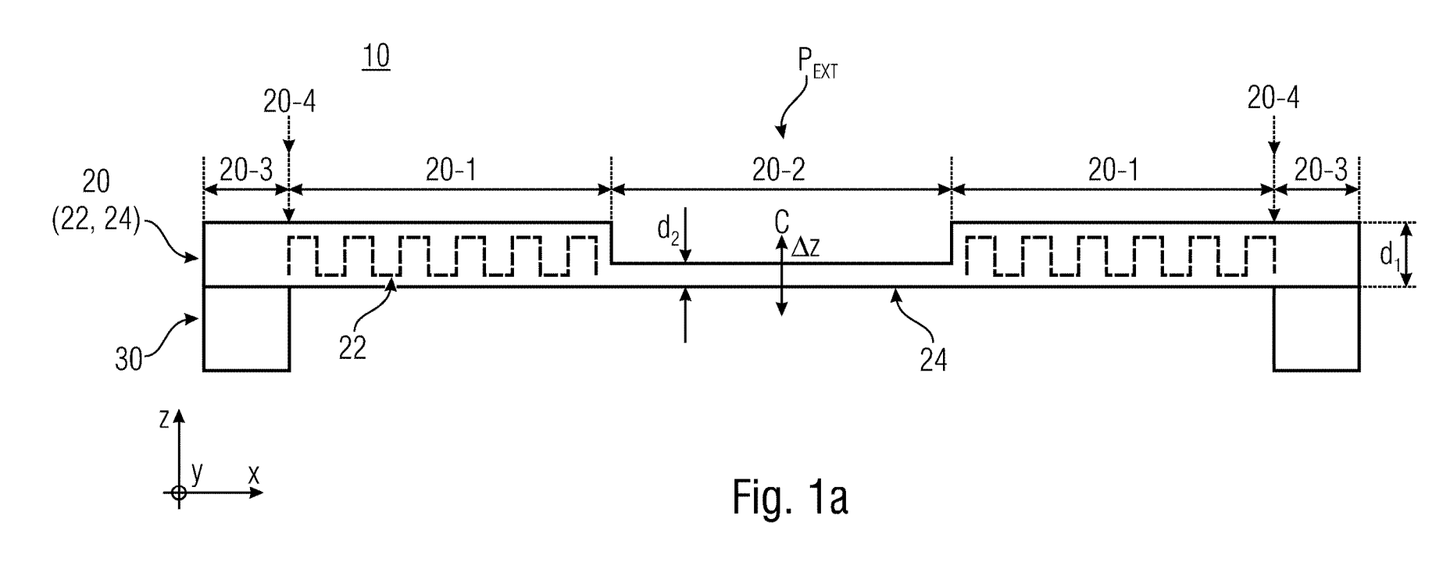
FIGS. 1a-1b show exemplary schematic cross-sectional views of the piezoelectric transducer according to an embodiment.
Figure 1B:
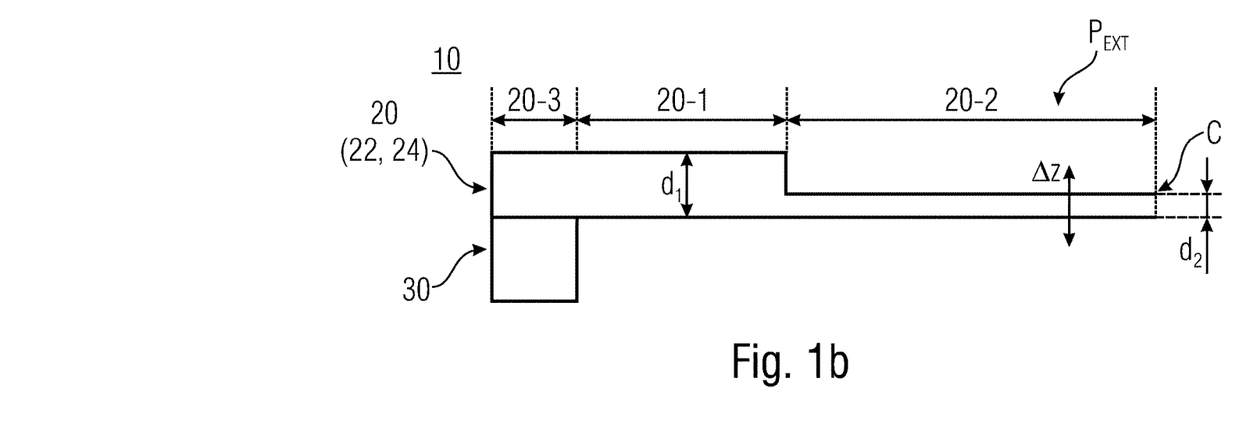

FIGS. 1a-1b show exemplary schematic cross-sectional views of the piezoelectric transducer 10 according to an embodiment. As shown in FIGS. 1a-1b the piezoelectric transducer comprises a deflectable structure 20 having a first portion 20-1 and a laterally adjoining second portion 20-2, wherein the first portion 20-1 comprises a piezoelectric layer 22 and the second portion 20-2 has an insulating material layer 24. The second portion 20-2 is arranged to have a higher rigidity and a smaller mass per unit area than the first portion 20-1.

Thus, embodiments of the piezoelectric transducer 10 provide a measure to reduce the weight of the transducer membrane, e.g. a corrugated piezoelectric microphone transducer membrane, of the transducer cantilever in areas that are not generating signal by themselves but contribute by transferring mechanical energy into areas of signal generation (buckled or bended membrane or cantilever areas). Based on this measure, the weight of the deflectable membrane or cantilever structure can be reduced in order to allow for higher compliance without lowering the resonance frequency, e.g. below 20 kHz.

The piezoelectric transducer 10 may form a microphone, e.g. a MEMS microphone (MEMS=microelectromechanical system) or a loudspeaker, e.g. a MEMS loudspeaker. Microphones are used for recording or detecting ambient sound or ambient noise. Loudspeakers are used for emitting acoustic or ultrasonic sound to the environment. Thus, the piezoelectric transducer 10 may be formed as an actuator (e.g., a loudspeaker) or a sensor (e.g., a microphone or pressure sensor).

According to an embodiment, the piezoelectric transducer 10 may be implemented as a piezoelectric sensor. The piezoelectric sensor uses the piezoelectric effect to measure changes in pressure, acceleration, temperature, strain or force by converting the resulting deflection or bending of the deflectable structure 20 into an electrical charge or electrical signal, respectively. The piezoelectric transducer 10 has (usually) a (very) high DC output impedance and can be modelled as a proportional voltage source. The output voltage of the piezoelectric sensor 10 is (generally) directly proportional to the applied force, pressure or strain, i.e., to the force, pressure or strain applied to the displaceable or deflectable structure 20 of the piezoelectric transducer 10.

In case of an implementation of the piezoelectric transducer 10 as a piezoelectric sensor, the deflection Δz of the deflectable structure 20 (i.e., a deflectable membrane structure or a deflectable cantilever structure) is based on the applied external pressure load $P_{EXT}$. The deflection Δz of the deflectable membrane structure 20 can then be detected and piezoelectrically read out, in order to provide a corresponding (analog or AD-converted digital) output signal of the piezoelectric transducer 10. The deflection Δz of the deflectable structure 20 is (generally) caused by an atmospheric (or static) pressure change or acoustically induced pressure changes in the environment.

According to a further embodiment, the piezoelectric transducer 10 may also be implemented as an actuator, e.g., in form of a piezoelectric speaker (loudspeaker or piezo bender due to its mode of operation) that uses the piezoelectric effect for generating sound. The initial mechanical motion is created by applying a voltage to the piezoelectric layer 22 of the first portion 20-1 of the deflectable structure 20, wherein this motion is typically converted into audible sound or ultrasonic sound using the deflectable structure 20 (having the first and second portions 20-1 and 20-2). When the deflectable structure 20 (e.g., a deflectable membrane structure or a deflectable cantilevered structure) is excited with an alternating voltage, this causes a motion of the deflectable structure 20 which gives the sound.

As exemplarily shown in FIG. 1a, the deflectable structure 20 comprises a deflectable membrane structure 20, which extends from a clamped border region 20-3 to a center point "C" of the deflectable membrane structure 20. The first portion 20-1 of the deflectable membrane structure 20 adjoins the clamped border region 20-3, wherein the second region 20-2 of the deflectable membrane structure 20 is arranged between the first region 20-1 and the center point C.

According to embodiments, the first portion 20-1 of the deflectable membrane structure 20 may be arranged to form between 50% and 95% of the deflectable membrane structure 20, for example. This percent value indicates the ratio between the electric active area (=the area of the first portion 20-1) and the electrical inactive (mechanical) area (=the area of the second portion 20-2) of the deflectable membrane structure 20. In a microphone implementation of the piezoelectric transducer 10 having a corrugated first portion 20-1 of the deflectable membrane structure 20, the ratio between the electric active area 20-1 and the mechanic area 20-2 of the deflectable membrane structure 20 may be between 55% and 85% (depending on the microphone variant). In case of an implementation of the piezoelectric transducer 10 as a loudspeaker, the radio between the electric area 20-1 and the mechanic area 20-2 of the deflectable membrane structure 20 may be up to 95%.

According to an embodiment, the deflectable membrane structure 20 may comprise a rectangular or square shape, a circular shape or a convex (or regular convex) polygon shape. Thus, the deflectable membrane structure 20 comprises the deflectable portion 20-1, 20-2, wherein the border region 20-3 is mechanically coupled or fixed (anchored) to a support or carrier structure 30, e.g., a substrate, wherein the deflectable portion 20-1, 20-2 may have a border or circumferential line 20-4.

The term "deflectable membrane structure" 20 is intended to illustrate that the deflectable membrane structure 20 may comprise at least one or a plurality of different (piezoelectric, conductive and/or insulating) layers, such as a stack or layer sequence of different piezoelectric, conductive and/or insulating layers. The first portion 20-1 of the deflectable membrane structure 20 may have a thickness d1 of about 1 μm or between 0.3 and 2 μm. The second portion 20-2 of the deflectable membrane structure 20 may have a thickness d2 of about 0.1 μm (or between 0.05 and 0.5 μm).

As exemplarily shown in FIG. 1a, the first portion 20-1 of the deflectable structure 20 of the piezoelectric transducer 10 is part of a deflectable membrane structure, and comprises the piezoelectric layer 22. The first portion 20-1 may further comprise contact structures (contact layers) which are connected to contact regions (or pads). Thus, the deflectable membrane structure 20 of the piezoelectric transducer 10 has the first portion 20-1 comprising the piezoelectric layer 22 and forms the piezoelectric transducing element. Thus, the piezoelectric layer 22 is fixed (e.g., mechanically coupled or attached) to or forms the first portion 20-1 of the deflectable membrane structure 20, wherein the first portion 20-1 of the deflectable membrane structure 20 may comprise (or may be made) at least partially or completely (of) piezoelectric material. The first portion 20-1 of the deflectable membrane structure 20 may comprise, for example, a corrugated shape, wherein the piezoelectric layer 22 and the contact structures (contact layers) are fixed (mechanically coupled or attached) to or form the first portion 20-1 of the deflectable membrane structure 20.

According to the embodiment of FIG. 1a, the deflectable membrane structure 20 may comprise a diaphragm, e.g., having a metallic, plastic, insulating or semiconductor material (e.g., polysilicon, etc.), wherein the piezoelectric layer 22 is fixed (e.g., mechanically coupled or attached) to the first portion 20-1 of the diaphragm (membrane). According to a further embodiment, the piezoelectric layer 22 of the first portion 20-1 itself may form the first portion 20-1 of the deflectable membrane structure 20, wherein the first portion 20-1 of the deflectable membrane structure 20 may consist of or may comprise the piezoelectric layer 22.

As exemplarily shown in FIG. 1b, the deflectable structure 20 of the piezoelectric transducer 10 may comprise a deflectable cantilevered structure 20 which extends from a clamped border region 20-3 to an end region (or end point) "C" of the deflectable cantilevered structure 20, wherein the first portion 20-1 adjoins the clamped border region 20-3 and the second region 20-2 is arranged between the first region 20-1 and the end region "C" of the deflectable cantilevered structure 20.

According to the embodiment, the first portion 20-1 comprising the piezoelectric layer 22 is arranged to form between 40% and 60% of the deflectable cantilevered structure 20. For rectangular cantilevers 20 (rectangular deflectable cantilevered structures) an effective ratio between the electric area 20-1 and the mechanic area (stiff tip) 20-2 may be about 45%. In case of a triangular cantilever design, the radio between the electric area 20-1 and the mechanic area 20-2 of the deflectable cantilevered structure 20 may be about 58%.

According to an embodiment, the deflectable cantilevered structure 20 may comprise a cantilever or bending beam. According to a further embodiment, the deflectable cantilevered structure 20 may comprise a segment or sector (section) of a rectangular or square shape, a circular shape or convex (or regular convex) polygon shape.

The term "deflectable cantilevered structure" 20 is intended to illustrate that the deflectable cantilevered structure 20 may comprise at least one or a plurality of different (piezoelectric, conductive and/or insulating) layers, such as a stack or layer sequence of different piezoelectric, conductive and/or insulating layers. The first portion 20-1 of the deflectable cantilevered structure 20 may have a thickness d1 of about 1 μm or between 0.3 and 2 m. The second portion 20-2 of the deflectable cantilevered structure 20 may have a thickness d2 of about 0.1 μm (or between 0.05 and 0.5 μm).

As exemplarily shown in FIG. 1b, the first portion 20-1 of the deflectable structure 20 of the piezoelectric transducer 10 is part of a deflectable cantilevered structure, and comprises the piezoelectric layer 22. The first portion 20-1 may further comprise contact structures (contact layers) which are connected to contact regions (or pads). Thus, the deflectable cantilevered structure 20 of the piezoelectric transducer 10 has the first portion 20-1 comprising the piezoelectric layer 22 and forms the piezoelectric transducing element. Thus, the piezoelectric layer 22 is fixed (e.g., mechanically coupled or attached) to or forms the first portion 20-1 of the deflectable cantilevered structure 20, wherein the first portion 20-1 of the deflectable cantilevered structure 20 may comprise (or may be made) at least partially or completely (of) piezoelectric material. The first portion 20-1 of the deflectable cantilevered structure 20 may comprise, for example, a corrugated shape, wherein the piezoelectric layer 22 and the contact structures (contact layers) are fixed (mechanically coupled or attached) to or form the first portion 20-1 of the deflectable cantilevered structure 20.

According to the embodiment of FIG. 1b, the deflectable cantilevered structure 20 may comprise a cantilever or bending beam, wherein the piezoelectric layer 22 is fixed (e.g., mechanically coupled or attached) to the first portion 20-1 of the cantilever or bending beam. According to a further embodiment, the piezoelectric layer 22 of the first portion 20-1 itself may form the first portion 20-1 of the cantilever or bending beam 20, so that the first portion 20-1 of the deflectable cantilevered structure 20 may comprise or may consist of the piezoelectric layer 22.

According to the embodiments of the piezoelectric transducer 10 of FIGS. 1a-1b, the rigidity (compliance or spring constant) and the mass per unit area of the deflectable structure 20 (=the deflectable membrane structure or deflectable cantilevered structure) may be based on size, thickness and shape of the deflectable structure comprising the first and second portions 20-1, 20-2. In order to achieve an efficient electro-mechanical transduction of the piezoelectric material (layer) 22 of the first portion 20-1 of the deflectable structure 20, the deflectable structure 20 should comply with specific physical characteristics such as the resulting compliance and mass.

In case of piezoelectric sensors, such as piezoelectric electric microphones, this can essentially be achieved by softening the deflectable structure 20 (for achieving a higher compliance) wherein care has to be taken that the first resonance frequency of the transducer 10 is kept well outside the audio band of 20 Hz-20 kHz. The first resonance frequency $f_o$ is essentially determined by the effective mechanical spring constant k (compliance) and by the effective weight m (mass) of the deflectable structure 20 of the piezoelectric transducer 10 according to the following equation:

$$\varpi_0 = \sqrt{\frac{k}{m}} = 2\pi f_0$$

Embodiments of the piezoelectric transducers 10 allow to keep the weight of the deflectable structure 20 relatively low. This allows for a low spring constant k (to improve the sensitivity) and still have a sufficiently high first resonance frequency $f_o$.

To be more specific, embodiments realize a measure to reduce the weight of the deflectable structure 20 of the piezoelectric transducer 10 and especially of the electrical inactive areas (second portions) 20-2 of the deflectable structure 20, that are not generating a signal by themselves but contribute by transferring mechanical energy into the areas (first portions 20-1) of signal generation (by means of the piezoelectric layer 22). By this, the weight (mass per unit area) of the deflectable structure 20 can be reduced in order to allow for higher compliance without lowering the resonance frequency fo below 20 kHz, for example.

According to an embodiment of the piezoelectric transducer 10, the first portion 20-1 of the deflectable structure 20 comprises at least one corrugation (or a corrugation, e.g. having at least one or a plurality of flutings) with a corrugated piezoelectric transducing layer 22. In case, the first portion 20-1 of the deflectable structure 20 also comprises the insulating material layer (passivation layer) 24 on the piezoelectric transducing layer 22, the insulating material layer (passivation layer) 24 is also corrugated.

According to an embodiment of the piezoelectric transducer 10, the piezoelectric layer 22 of the first portion 20-1 is arranged to provide an electrical output signal $S_{OUT}$ in response to a deflection of the deflectable structure 20. The piezoelectric layer 22 of the first portion 20-1 may be arranged to provide the electrical output signal $S_{OUT}$ in response to a mechanical stress in the piezoelectric layer 22 based on the deflection $\Delta z$ of the deflectable structure 20.

According to an embodiment of the piezoelectric transducer 10, the piezoelectric layer 22 of the first portion 20-1 may be arranged to provide a deflection of the deflectable structure 20 in response to an electrical input signal $S_{IN}$.

According to an embodiment of the piezoelectric transducer 10, the insulating material layer 24 of the second portion 20-2 of the deflectable structure 20 may comprise a structural stiffening element 26 for increasing the rigidity of the second portion 20-2 when compared to the first portion 20-1 of the deflectable structure 20.

According to an embodiment of the piezoelectric transducer 10, the structural element 26 may comprise at least one of a rib, a ridge, a hole, a flap and an additional stiffening layer. According to an embodiment, the structural element 26 of the insulating layer may comprises at least one of a piezoelectric material and an insulating material.

According to an embodiment of the piezoelectric transducer 10, only the first portion 20-1 of the defection structure 20 may comprise the piezoelectric layer 22.

According to an embodiment of the piezoelectric transducer 10, only the second portion 20-2 of the deflection structure 20 may comprise the insulating layer 24. Thus, the second portion 20-2 of the piezoelectric (layer) structure 22 may only comprise (consist of) the insulating material 24.

According to an embodiment of the piezoelectric transducer 10, the first portion 20-1 of the deflection structure 20 comprises a layer stack having the piezoelectric layer 22 for generating the electrical output signal Sour and an insulating material layer 24.

According to an embodiment of the piezoelectric transducer 10, the first and second portion 20-1, 20-2 of the deflection structure 20 comprise the same insulating material layer 24.

According to embodiments of the piezoelectric transducer 10 of FIGS. 1a-1b, the (e.g., corrugated) first portion 20-1 of the deflectable structure 10 may only require one (a single) piezoelectric layer 22 and is therefore already comparatively lightweight. According to the embodiments, the weight is further reduced by reducing the amount of piezoelectric material in the mechanical area (second portion) 20-2 of the deflectable structure 20, where the deflectable structure 20 fulfils a purely mechanic function and does not directly generate an output signal by itself. In these "purely mechanic" area(s) 20-2 of the deflectable structure 20, the deflectable structure 20 comprises a lightweight construction which can be implemented by means of a flat and favorably purely non-piezoelectric material stack (having an insulating material layer) or by means of a "ridge-like" construction. The ridges may comprise piezoelectric material or a non-piezoelectric material, e.g., an insulating material such as an oxide or nitride material.

In the following, further possible implementations of the piezoelectric transducer 10 are exemplarily described. In the present description of embodiments, the same or similar elements having the same structure and/or function are provided with the same reference numbers or the same name, wherein a detailed description of such elements will not be repeated for every embodiment.

Thus, the above description with respect to FIGS. 1a-1b is equally applicable to the further embodiments as described below. In the following description, essentially the differences, e.g. additional elements, to the embodiment as shown in FIG. 1a and the technical effect(s) resulting therefrom are discussed in detail.

Figure 2A:
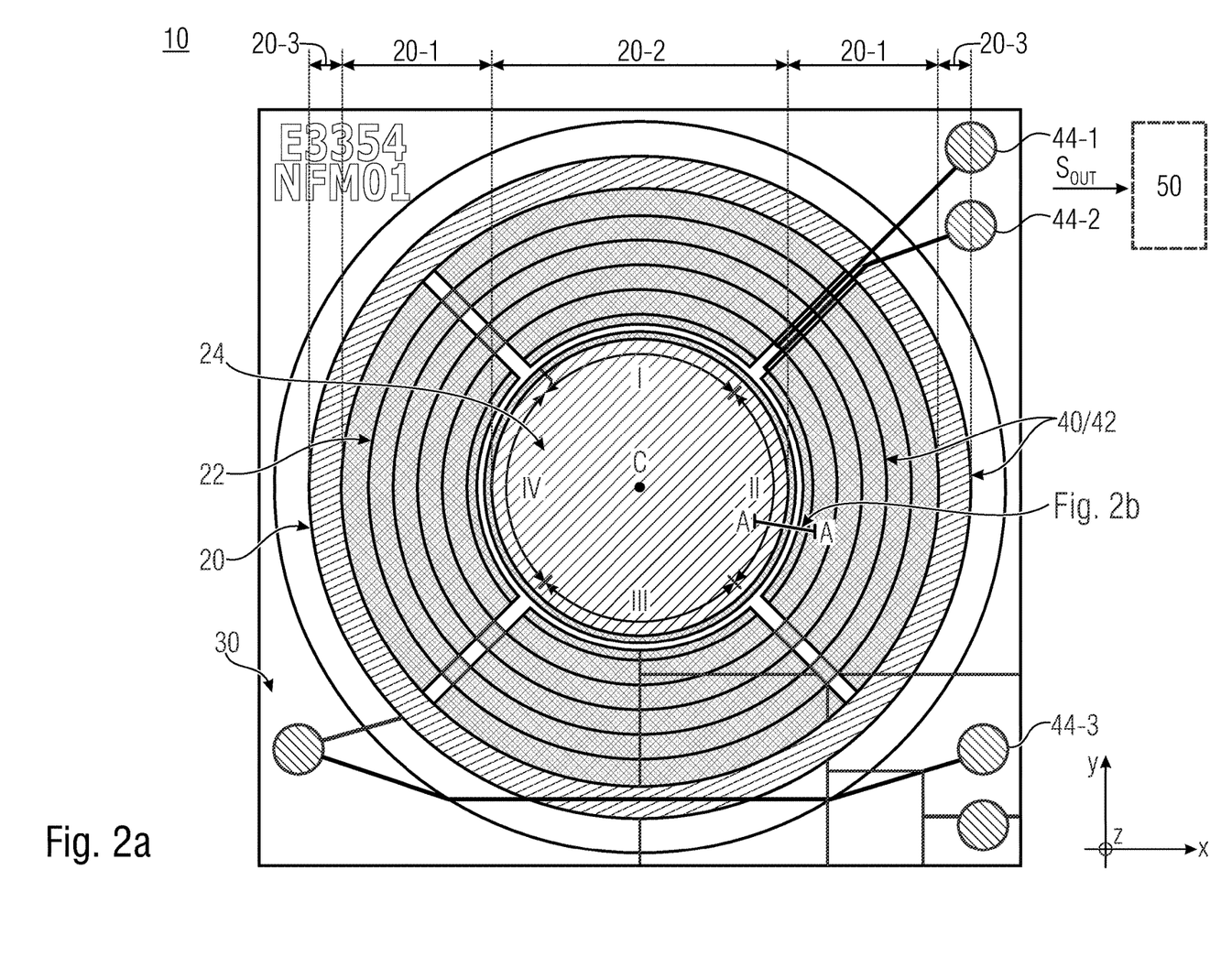
FIG. 2a shows a schematic plain view (top view) of the piezoelectric transducer according to a further embodiment.
Figure 2B:
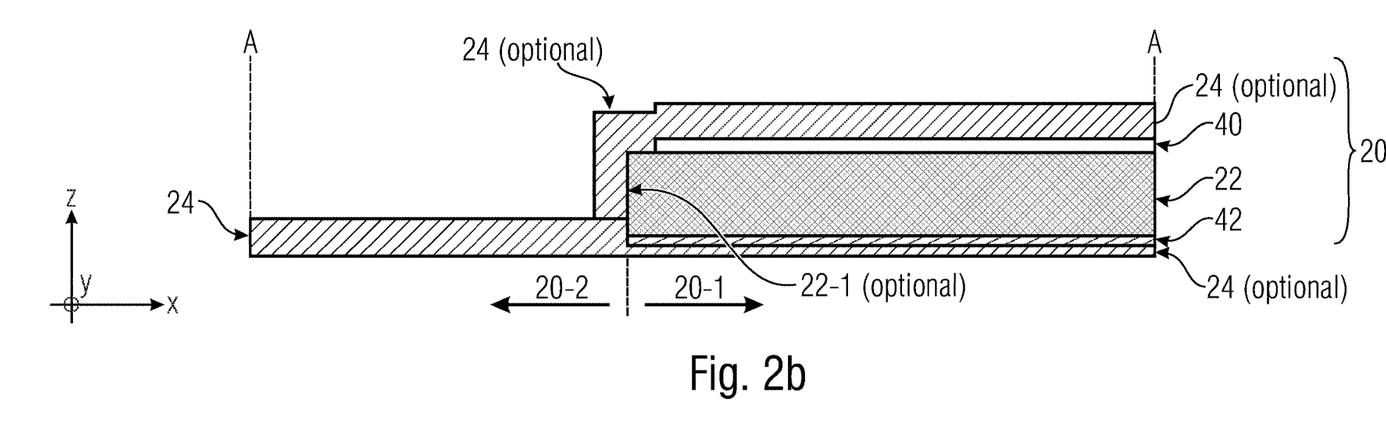
Figure 2C:
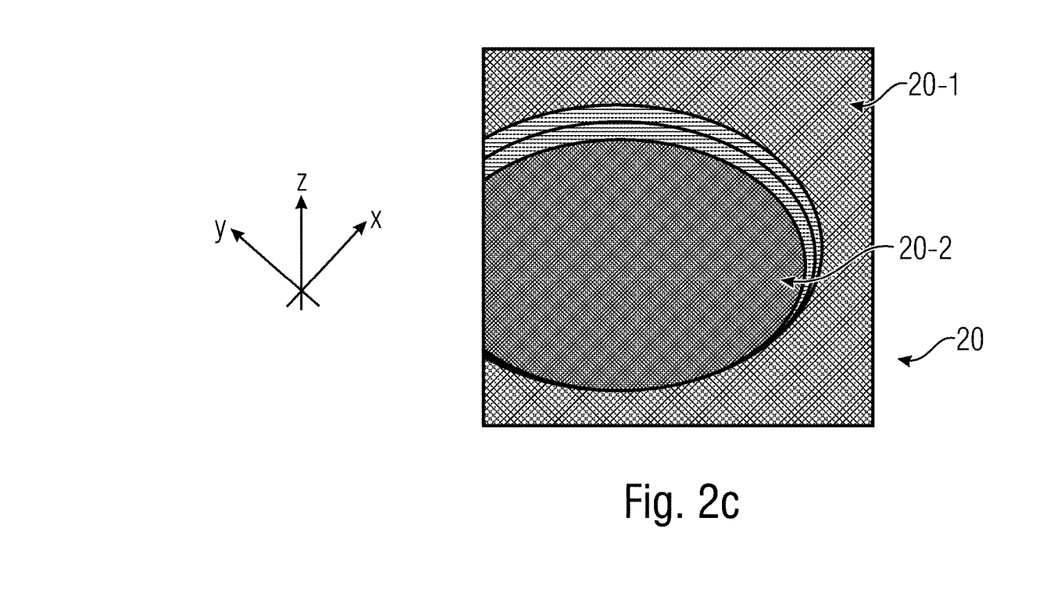
FIG. 2c shows a schematic 3D view of the piezoelectric transducer of FIGS. 2a-2b.

FIG. 2a shows a schematic plain view (top view) of the piezoelectric transducer 10 according to a further embodiment. FIG. 2b shows a schematic (partial) cross-sectional view of a portion of the piezoelectric transducer 10 of FIG. 2a (along the section line AA). FIG. 2c shows a schematic partial 3D view of the piezoelectric transducer 10 of FIGS. 2a-2b.

As shown in FIGS. 2a-2c the piezoelectric transducer comprises the deflectable membrane structure 20 having the first portion 20-1 and the laterally adjoining second portion 20-2, wherein the first portion 20-1 comprises the piezoelectric layer 22 and the second portion 20-2 comprises the insulating material layer 24. The second portion 20-2 is arranged to have a higher rigidity and a smaller mass per unit area than the first portion 20-1. As exemplarily shown in FIG. 2a, the deflectable membrane structure 20 extends from the clamped border region 20-3 to the center point "C" of the deflectable membrane structure 20. The first portion 20-1 of the deflectable membrane structure 20 adjoins the clamped border region 20-3, wherein the second region 20-2 of the deflectable membrane structure 20 is arranged between the first region 20-1 and the center point C.

As exemplarily shown in FIG. 2a, the first portion 20-1 of the deflectable structure 20 of the piezoelectric transducer 10 is formed as a deflectable membrane structure and comprises the piezoelectric layer 22. The first portion 20-1 may further comprise contact structures (contact layers) 40, 42 which are connected to contact regions (pads or terminals) 44-1, 44-2, 44-3. Thus, the deflectable membrane structure 20 of the piezoelectric transducer 10 has the first portion 20-1 comprising the piezoelectric layer 22 and forms the piezoelectric transducing element. Thus, the piezoelectric layer 22 is fixed to or forms the first portion 20-1 of the deflectable membrane structure 20. The first portion 20-1 of the deflectable membrane structure 20 may comprise, for example, a corrugated shape.

The contact regions 44-1, 44-2, 44-3 provide for electrical contacts and connections from the contact structures (contact layers) 40, 42 of the piezoelectric (layer) structure 22 e.g. to a control circuitry (ASIC) 50 of the MEMS device 10. As shown in FIG. 2a, the control circuitry 50 is configured to read out the sense signal $S_{OUT}$ from the piezoelectric MEMS transducer 10 at the terminal(s) 44-1 and/or 44-2.

According to an embodiment of the piezoelectric transducer 10, the piezoelectric layer 22 of the first portion 20-1 is arranged to provide an electrical output signal $S_{OUT}$ in response to a deflection of the deflectable structure 20. The piezoelectric layer 22 of the first portion 20-1 may be arranged to provide the electrical output signal $S_{OUT}$ in response to a mechanical stress in the piezoelectric layer 221 based on the deflection Δz of the deflectable structure 20.

As exemplarily shown in FIG. 2a, the deflectable membrane structure 20 of the piezoelectric MEMS transducer 10 may be segmented and may comprise the membrane segments I, II, III, IV and a segmented piezoelectric (layer) structure 22 having accordingly formed piezoelectric structure segments and may comprise a segmented contact structure (contact layer) 40, 42 having accordingly formed contact structure (contact layer) segments, wherein the (e.g., four) segments I, II, III and IV of the deflectable membrane structure 20 are serially connected. According to a further embodiment, the deflectable membrane structure 20 may also comprise a continuous (not-segmented or one-piece) structure.

According to an embodiment of the piezoelectric transducer 10, the first portion 20-1 of the deflectable structure 20 comprises a corrugation with a corrugated piezoelectric transducing layer 22. According to embodiments of the piezoelectric transducer 10 of FIGS. 2a-2c, the corrugated first portion 20-1 of the deflectable structure 10 may only require one (a single) piezoelectric layer 22 (and the contact structures 40, 42) and is therefore already comparatively lightweight.

As exemplarily shown in the embodiment of the piezoelectric transducer 10 of FIGS. 2a-2c, only the first portion 20-1 of the defection structure 20 may comprise the piezoelectric layer 22. Further, only the second portion 20-2 of the deflection structure 20 may comprise the insulating layer 24. According to an embodiment, the second portion 20-2 of the piezoelectric (layer) structure 22 may only comprise (consist of) the insulating material 24.

As exemplarily shown in FIG. 2b, the edge 22-1 of the piezoelectric layer 22 (facing to the second portion 20-2 of the deflectable membrane structure 20) may be covered (passivated or PECVD passivated) with the insulating layer 24, e.g. having a SiN material. A SiN material may provide during an PECVD process a good corner or edge coverage.

Thus, according to the embodiment of FIGS. 2a-2c, the weight of the deflectable membrane structure 20 is further reduced by reducing the amount of piezoelectric material in the mechanical areas (second portions) 20-2 of the deflectable structure 20, where the deflectable structure 20 fulfils a purely mechanic function and does not directly generate an output signal by itself. In these "purely mechanic" areas 20-2 of the deflectable structure 20, the deflectable structure 20 comprises a lightweight construction which can be implemented by means of a flat and favorably purely non-piezoelectric material layer or layer stack (having an insulating material layer).

Thus, according to the embodiment of FIGS. 2a-2c, the passivation layer 24 is only arranged in the center of the deflectable membrane structure 20, i.e. the passivation layer 24 forms the second portion 20-2 of the deflectable membrane structure 20. Thus, the second portion 20-2 of the piezoelectric (layer) structure 22 may only comprise or consist of the insulating material 24.

As exemplarily shown in the embodiment of the piezoelectric transducer 10 of FIGS. 2a-2c, the first portion 20-1 of the deflection structure 20 comprises a layer stack 22, 24 having the piezoelectric layer 22 for generating the electrical output signal $S_{OUT}$ and an insulating material layer 24. The layer stack may further comprise the contact structures (contact layers) 40, 42 of the piezoelectric (layer) structure 22.

FIG. 2c shows a schematic partial 3D view of the piezoelectric transducer 10 of FIGS. 2a-2b. In particular, FIG. 2c shows an example of the edge profile after the piezo-etch process for removing the piezoelectric layer 22 from the second portion 20-2 of the deflectable membrane structure 20.

In the following description, essentially the differences, e.g. additional elements, to the embodiment(s) as shown in FIGS. 1a, 2a-2c and the technical effect(s) resulting therefrom are discussed in detail.

Figure 3A:
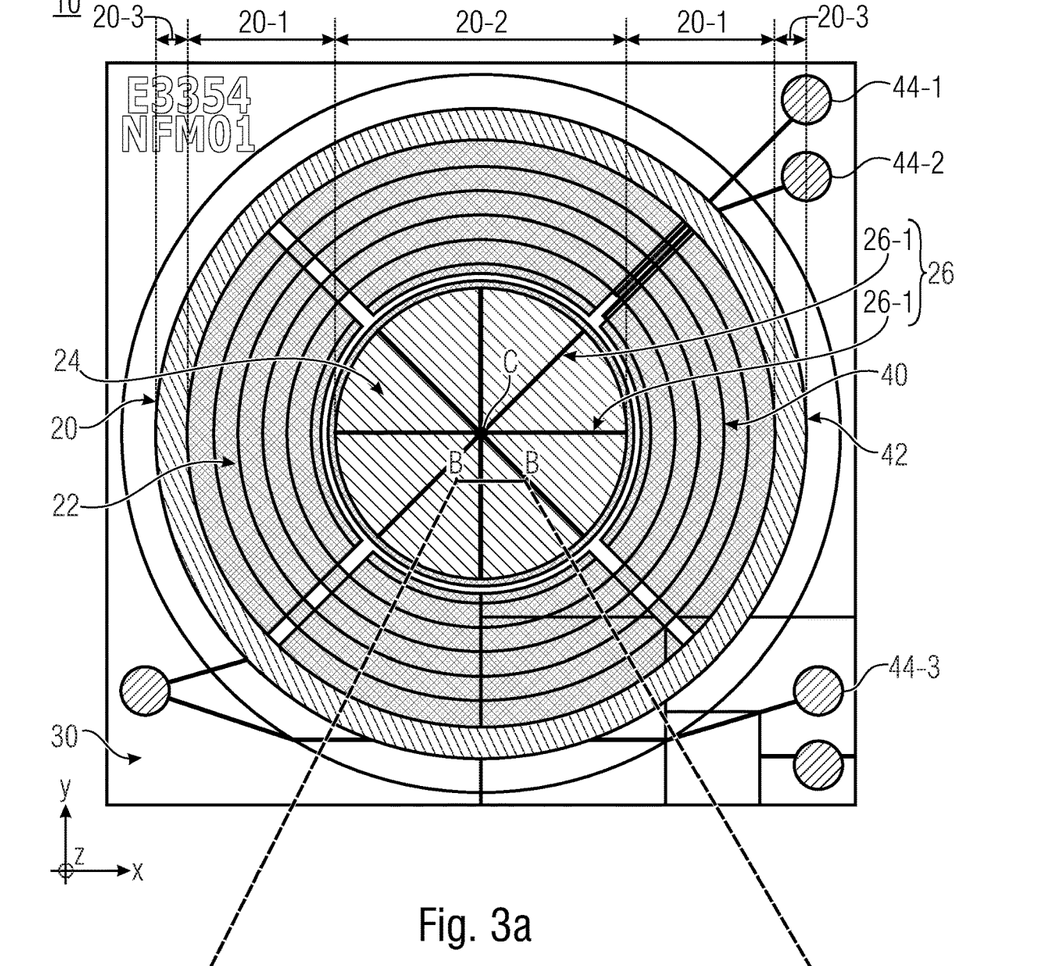
FIG. 3a shows a schematic plain view of a piezoelectric transducer according to a further embodiment.
Figure 3B:
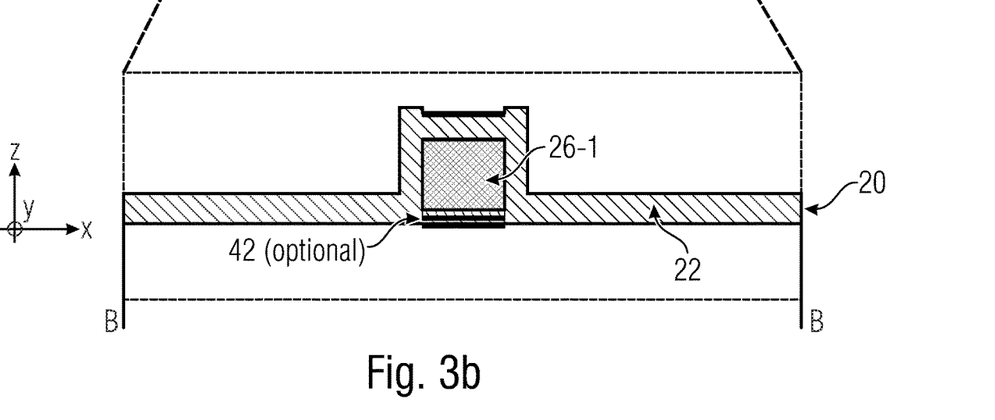

FIG. 3a shows a schematic plain view of a piezoelectric transducer according to a further embodiment. FIG. 3b shows a schematic cross-sectional view of a portion of the piezoelectric transducer of FIG. 3a (along the section line BB).

As shown in FIGS. 3a-3b, the piezoelectric transducer comprises the deflectable membrane structure 20 having the first portion 20-1 and the laterally adjoining second portion 20-2, wherein the first portion 20-1 comprises the piezoelectric layer 22 and the second portion 20-2 has the insulating material layer 24. The second portion 20-2 is arranged to have a higher rigidity and a smaller mass per unit area than the first portion 20-1. As exemplarily shown in FIG. 2a, the deflectable membrane structure 20 extends from the clamped border region 20-3 to the center point "C" of the deflectable membrane structure 20. The first portion 20-1 of the deflectable membrane structure 20 adjoins the clamped border region 20-3, wherein the second region 20-2 of the deflectable membrane structure 20 is arranged between the first region 20-1 and the center point C. The first portion 20-1 of the deflectable structure 20 may comprise a corrugation with a corrugated piezoelectric transducing layer 22.

According to an embodiment of the piezoelectric transducer 10, the second portion 20-2 of the deflectable membrane structure 20 comprises the structural stiffening element 26 for increasing the rigidity of the second portion 20-2 when compared to the first portion 20-1 of the deflectable membrane structure 20. According to an embodiment of the piezoelectric transducer 10, the structural stiffening element 26 of the insulating layer 24 may comprise at least one of a rib, a ridge and grid structure (or pattern) 26-1.

According to an embodiment of the piezoelectric transducer 10, only the second portion 20-2 of the deflection structure 20 may comprise the insulating layer 24. Thus, the second portion 20-2 of the piezoelectric (layer) structure 22 may only comprise (consist of) the insulating material 24 and the structural stiffening element 26.

Thus, according to the embodiment of FIGS. 3a-3b, the weight is further reduced by reducing the amount of piezoelectric material in the mechanical areas (second portions) 20-2 of the deflectable structure 20, where the deflectable structure 20 fulfils a purely mechanic function and does not directly generate an output signal by itself. In these "purely mechanic" areas 20-2 of the deflectable structure 20, the deflectable structure 20 comprises a lightweight construction which can be implemented by means of a flat material stack (having an insulating material layer), wherein a structural stiffening element 26 for increasing the rigidity of the second portion 20-2 is arranged on or in combination with the insulating material layer 24 (passivation layer). The structural stiffening element 26 of the insulating layer 24 may comprise a rib, ridge (beam) or grid pattern 26-1.

Thus, according to the embodiment of FIGS. 3a-3b, the passivation layer 24 and the structural stiffening element 26 are arranged in the center of the deflectable membrane structure 20, i.e. the passivation layer 24 forms together with the structural stiffening element 26 the second portion 20-2 of the deflectable membrane structure 20.

Thus, the second portion 20-2 of the deflectable membrane structure 20 is stiff enough and has also a comparatively low weight. As exemplarily shown in FIG. 3a, the structural stiffening element 26 may formed as a star type or may have a star shape. The structural stiffening element 26 may comprise (symmetrically arranged) stiffening portions 26-1 (e.g., beams or rays) which radially extend from the center C to the edge 22-1 of the second portion 20-2 of the deflectable membrane structure 20, for example. However, other designs like grids of backplate-style shapes are possible for the structural stiffening element 26.

As exemplarily shown in the schematic cross-sectional view of FIG. 3b, the structural stiffening element 26 may be optionally covered with the passivation layer 24. According to a further embodiment, the structural stiffening element 26 may be at least partially exposed or completely exposed (except for the contact region with the passivation layer 24), wherein the structural stiffening element 26 may be arranged on passivation layer 24.

In the following description, essentially the differences, e.g. additional elements, to the embodiment as shown in FIGS. 1a, 2a-2c, 3a-3b and the technical effect(s) resulting therefrom are discussed in detail.

Figure 4A:
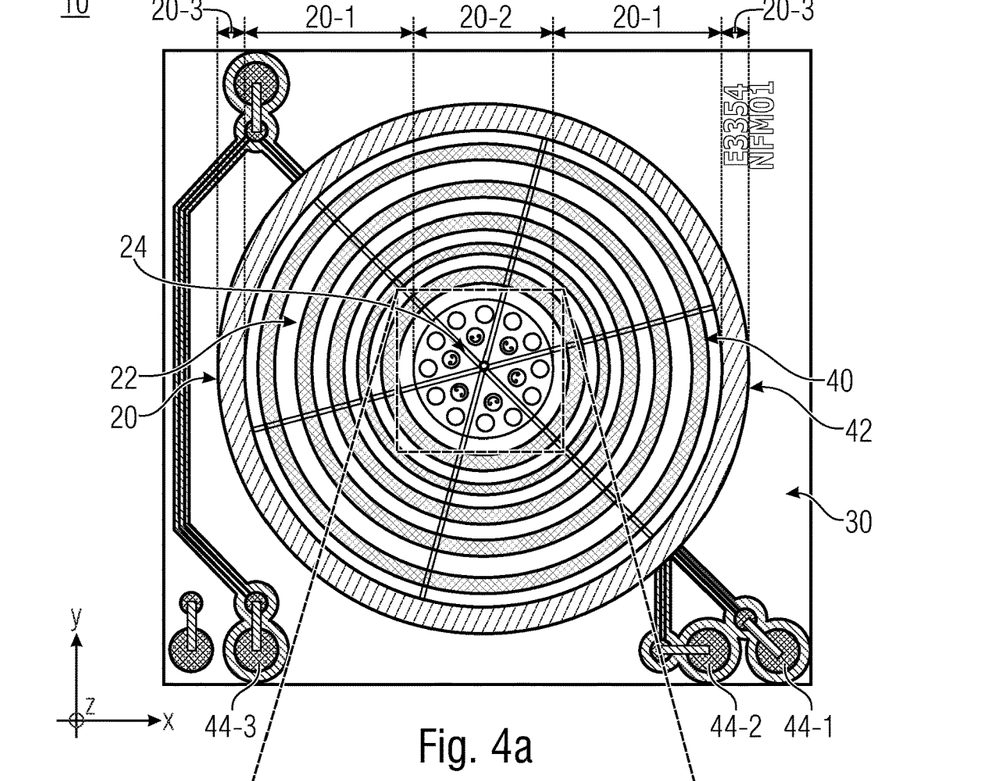
FIG. 4a shows a schematic plain view of a piezoelectric transducer according to a further embodiment.
Figure 4B:
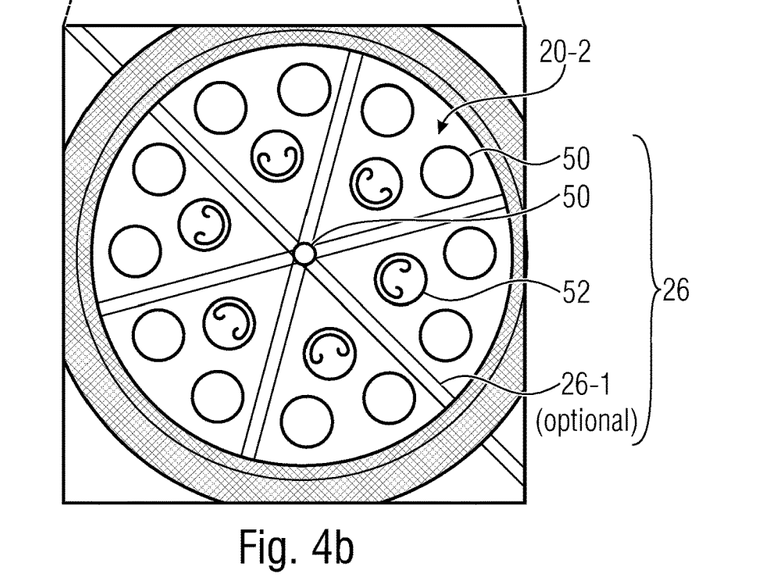

FIG. 4a shows a schematic plain view of a piezoelectric transducer 10 according to a further embodiment. FIG. 4b shows a schematic plain view of a portion of the piezoelectric transducer of FIG. 4a.

As shown in FIGS. 4a-4b, the piezoelectric transducer 10 comprises the deflectable membrane structure 20 having the first portion 20-1 and the laterally adjoining second portion 20-2, wherein the first portion 20-1 comprises the piezoelectric layer 22 and the second portion 20-2 has the insulating material layer 24. The second portion 20-2 is arranged to have a higher rigidity and a smaller mass per unit area than the first portion 20-1. As exemplarily shown in FIG. 4a, the deflectable membrane structure 20 extends from the clamped border region 20-3 to the center point "C" of the deflectable membrane structure 20. The first portion 20-1 of the deflectable membrane structure 20 adjoins the clamped border region 20-3, wherein the second region 20-2 of the deflectable membrane structure 20 is arranged between the first region 20-1 and the center point C.

According to an embodiment of the piezoelectric transducer 10, the second portion 20-2 of the deflectable membrane structure 20 may comprise the structural stiffening element 26 for increasing the rigidity of the second portion 20-2 when compared to the first portion 20-1 of the deflectable membrane structure 20. According to an embodiment of the piezoelectric transducer 10, the structural stiffening element 26 may comprise at least one of a hole 50 and a flap 52, e.g. in form of a perforation or opening in the second portion 20-2 of the deflectable membrane structure 20.

As exemplarily shown in the schematic cross-sectional view of FIGS. 4a-4b, the second portion 20-2 of the deflectable membrane structure 20 may comprise perforations or openings 50, 52, wherein at least a part of (or all) the perforations or openings 50, 52 may comprise the shape of a flap 52 (=wing or fin) in the second portion 20-2 of the membrane structure 20. The flaps 52 are elastically coupled to the membrane structure 20, wherein the flaps 50 may form an integral portion of the membrane structure 20. The perforations or openings 50, 52 may be symmetrically arranged in the second portion 20-2 of the deflectable membrane structure 20. The perforations or openings 50, 52 can provide a ventilation path through the deflectable membrane structure 20.

Thus, according to the embodiment of FIGS. 4a-4b, the "purely mechanic" area (second portion) 20-2 of the deflectable structure 20, the deflectable structure 20 comprises a lightweight construction which can be implemented by means of a flat material stack (having an insulating material layer), wherein the perforations or openings 50, 52, e.g. having the shape of a flap (=wing or fin), and optionally the rib, ridge (beam) or grid pattern 26-1 of the structural stiffening element 26 for increasing the rigidity of the second portion 20-2 are arranged in/on the second portion 20-2 of the deflectable structure 20. Thus, according to the embodiment of FIGS. 4a-4b, the passivation layer 24, the perforations or openings 50,52 and, optionally, the rib, ridge (beam) or grid pattern 26-1 of the structural stiffening element 26 are arranged in the center of the deflectable membrane structure 20, i.e. in the second portion 20-2 of the deflectable membrane structure 20.

Figures 5A, 5B:
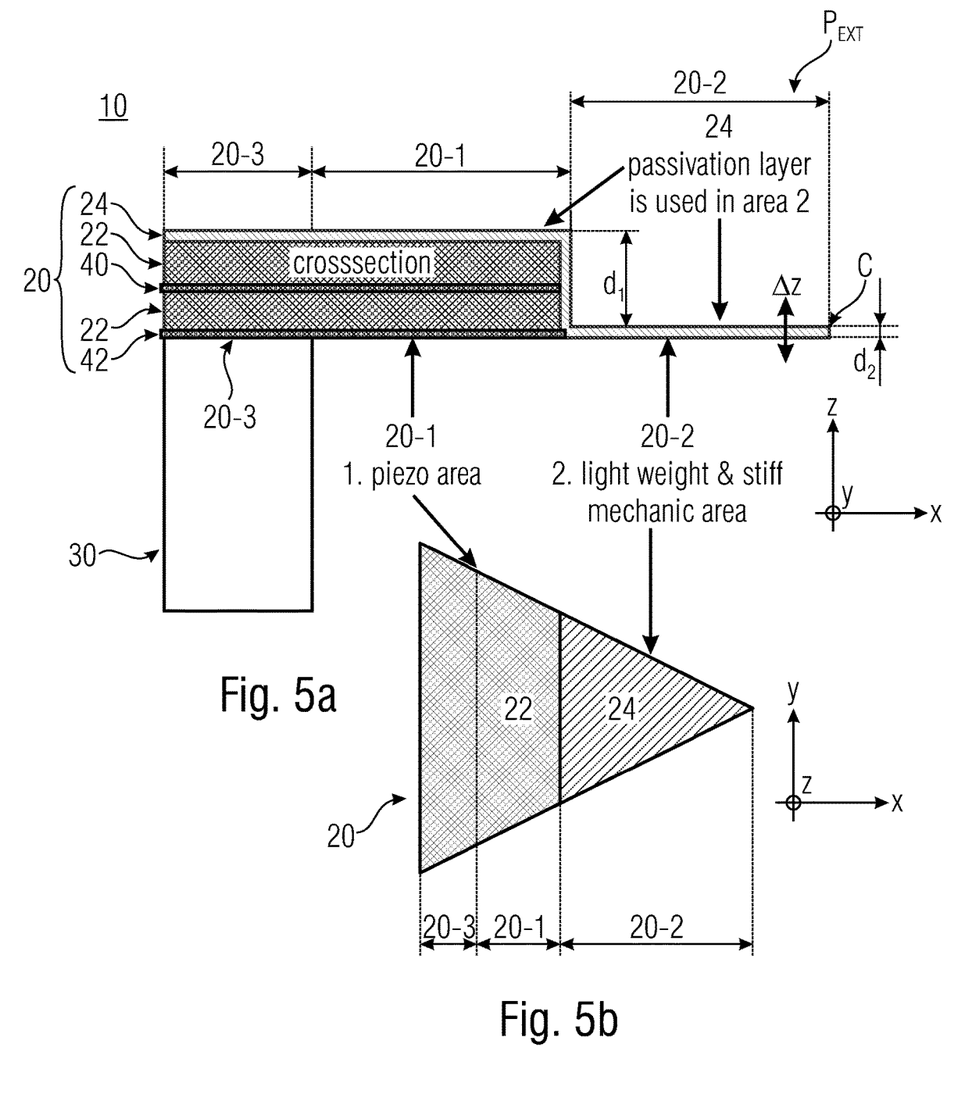

In the following description of FIGS. 5a-5b, essentially the differences, e.g. additional elements, to the embodiment as shown in FIG. 1b and the technical effect(s) resulting therefrom are discussed in detail. FIG. 5a shows a schematic cross-sectional view of a piezoelectric transducer 10 according to a further embodiment. FIG. 5b shows a schematic plain view of the piezoelectric transducer 10 of FIG. 5a.

As shown in FIGS. 5a-5b the piezoelectric transducer 10 comprises the deflectable cantilevered structure 20 having a first portion 20-1 and a laterally adjoining second portion 20-2, wherein the first portion 20-1 comprises a piezoelectric layer 22 and the second portion 20-2 has an insulating material layer 24. The second portion 20-2 is arranged to have a higher rigidity and a smaller mass per unit area than the first portion 20-1. The deflectable cantilevered structure 20 of the piezoelectric transducer 10 extends from a clamped border region 20-3 to an end region "C" of the structure 20, wherein the first portion 20-1 adjoins the clamped border region 20-3 and the second region 20-2 is arranged between the first region 20-1 and the end region "C" of the deflectable cantilevered structure 20.

According to an embodiment, the deflectable cantilevered structure 20 may comprise a cantilever or bending beam. According to a further embodiment, the deflectable cantilevered structure 20 may comprise a segment or sector (section) of a rectangular or square shape, a circular shape or convex (or regular convex) polygon shape. FIG. 5b exemplarily shows a triangle shape, e.g. an isosceles a triangle shape, of the deflectable cantilevered structure 20. The first portion 20-1 of the deflectable membrane structure 20 may have a thickness d1 of about 1 µm or between 0.3 and 2 µm. The second portion 20-2 of the deflectable membrane structure 20 may have a thickness d2 of about 0.1 µm (or between 0.05 and 0.5 µm).

As exemplarily shown in FIGS. 5a-5b, the first portion 20-1 of the deflectable structure 20 of the piezoelectric transducer 10 is part of a deflectable cantilevered structure, and comprises the piezoelectric layer 22. The first portion 20-1 may further comprise contact structures (contact layers) 40, 42 which are connected to contact regions (pads or terminals). Thus, the deflectable cantilevered structure 20 of the piezoelectric transducer 10 has the first portion 20-1 comprising the piezoelectric layer 22 and forms the piezoelectric transducing element. Thus, the piezoelectric layer 22 is fixed (e.g., mechanically coupled or attached) to or forms the first portion 20-1 of the deflectable cantilevered structure 20, wherein the first portion 20-1 of the deflectable cantilevered structure 20 may comprise (or may be made) at least partially or completely (of) piezoelectric material. The first portion 20-1 of the deflectable cantilevered structure 20 may comprise, for example, a corrugated shape, wherein the piezoelectric layer 22 and the contact structures (contact layers) are fixed (mechanically coupled or attached) to the first portion 20-1 or form the first portion 20-1 of the deflectable cantilevered structure 20.

According to the embodiment of FIG. 1b, the deflectable cantilevered structure 20 may comprise a cantilever or bending beam, wherein the piezoelectric layer 22 is fixed (e.g., mechanically coupled or attached) to the first portion 20-1 of the cantilever or bending beam. According to a further embodiment, the piezoelectric layer 22 of the first portion 20-1 itself may form the first portion 20-1 of the cantilever or bending beam 20, so that the first portion 20-1 of the deflectable cantilevered structure 20 may comprise or may consist of the piezoelectric layer 22.

According to the embodiment of the piezoelectric transducer 10, only the first portion 20-1 of the defection structure 20 may comprise the piezoelectric layer 22. According to an embodiment of the piezoelectric transducer 10, only the second portion 20-2 of the deflection structure 20 may comprise the insulating layer 24. Thus, the second portion 20-2 of the piezoelectric (layer) structure 22 may only comprise (consist of) the insulating material 24.

According to an embodiment of the piezoelectric transducer 10, the first portion 20-1 of the cantilevered deflection structure 20 comprises a layer stack having the piezoelectric layer 22 for generating the electrical output signal Sour and an insulating material layer 24.

According to a further embodiment of the piezoelectric transducer 10, the first and second portion 20-1, 20-2 of the deflection structure 20 may comprise the same insulating material layer (passivation layer) 24.

Thus, according to the embodiment of FIGS. 5a-5b, the weight of the deflectable cantilevered structure 20 is reduced by reducing the amount of piezoelectric material in the mechanical areas (second portions) 20-2 of the deflectable cantilevered structure 20, where the deflectable structure 20 fulfils a purely mechanic function and does not directly generate an output signal by itself. In these "purely mechanic" areas 20-2 (=stiff tip) of the deflectable structure 20, the deflectable cantilevered structure 20 comprises a lightweight construction which can be implemented by means of a flat and favorably purely non-piezoelectric material layer or layer stack (having an insulating material layer 24).

Thus, according to the embodiment of FIGS. 5a-5b, the passivation layer 24 may be only arranged in the second portion 20-2 of the deflectable cantilevered structure 20, i.e. the passivation layer 24 forms the second portion 20-2 of the deflectable membrane structure 20. Thus, the second portion 20-2 of the piezoelectric (layer) structure 22 may comprises or consist only of the insulating material 24.

Figures 6A, 6B:
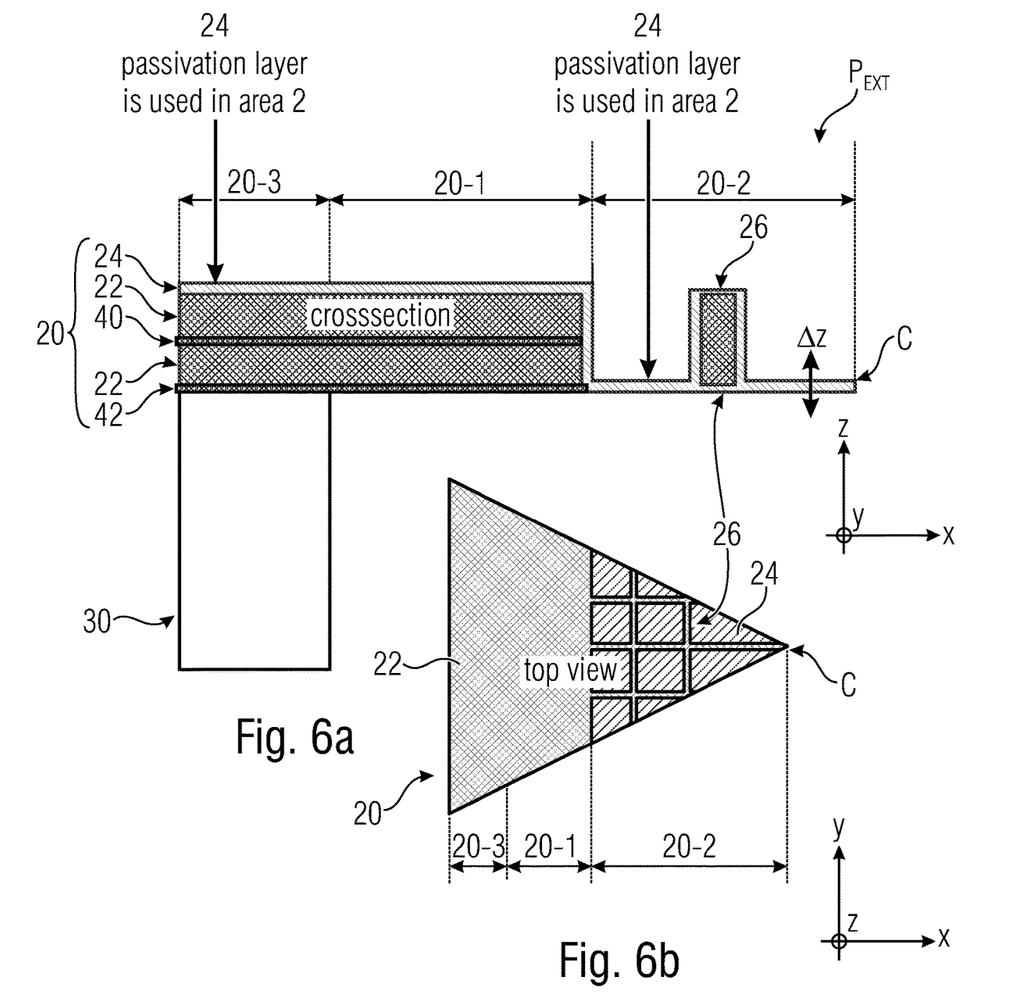

In the following description, essentially the differences, e.g. additional elements, to the embodiment as shown in FIGS. 1b and 5a-5b together with the technical effect(s) resulting therefrom are discussed in detail. FIG. 6a shows a schematic cross-sectional view of a piezoelectric transducer according to a further embodiment. FIG. 6b shows a schematic plain view of the piezoelectric transducer of FIG. 6a.

As shown in FIGS. 6a-6b the piezoelectric transducer 10 comprises the deflectable cantilevered structure 20 having a first portion 20-1 and a laterally adjoining second portion 20-2, wherein the first portion 20-1 comprises the piezoelectric layer 22 and the second portion 20-2 has the insulating material layer 24. The second portion 20-2 is arranged to have a higher rigidity and a smaller mass per unit area than the first portion 20-1. The deflectable cantilevered structure 20 of the piezoelectric transducer 10 extends from a clamped border region 20-3 to an end region "C" of the structure 20, wherein the first portion 20-1 adjoins the clamped border region 20-3 and the second region 20-2 is arranged between the first region 20-1 and the end region "C" of the deflectable cantilevered structure 20.

According to an embodiment of the piezoelectric transducer 10, the insulating material layer 24 of the second portion comprises a structural stiffening element 26 for increasing the rigidity of the second portion 20-2 when compared to the first portion 20-1 of the deflectable structure 20. According to an embodiment of the piezoelectric transducer 10, the structural stiffening element 26 of the insulating layer 24 may comprise at least one of a rib, ridge (beam) or grid structure 26-1 (e.g., a design like a grid of backplate-style shape). FIG. 6b exemplarily shows a rectangular pattern of the rib, ridge (beam) or grid structure 26-1.

According to an embodiment of the piezoelectric transducer 10, the first portion 20-1 of the deflection structure 20 may comprise a layer stack having the piezoelectric layer 22 for generating the electrical output signal Sour and an insulating material layer 24. According to an embodiment of the piezoelectric transducer 10, the first and second portion 20-1, 20-2 of the deflection structure 20 may comprise the same insulating material layer 24.

Thus, according to the embodiment of FIGS. 6a-6b, the weight the deflectable cantilevered structure 20 is reduced by reducing the amount of piezoelectric material in the mechanical areas (second portions) 20-2 of the deflectable structure 20. In the "purely mechanic" second areas 20-2 of the deflectable structure 20, the deflectable structure 20 comprises a lightweight construction which can be implemented by means of a flat material stack (having an insulating material layer 24), wherein a structural stiffening element 26 for increasing the rigidity of the second portion 20-2 is arranged on or in combination with the insulating material layer 24 (passivation layer). The structural stiffening element 26 of the insulating layer 24 may comprise a rib, ridge (beam) or grid pattern.

Thus, according to the embodiment of FIGS. 6a-6b, the passivation layer 24 and the structural stiffening element 26 are arranged at the second portion 20-2 of the deflectable membrane structure 20, i.e. the passivation layer 24 may form together with the structural stiffening element 26 the second portion 20-2 of the deflectable membrane structure 20.

Thus, the second portion 20-2 of the deflectable membrane structure 20 is stiff enough and has also a comparatively low weight. As exemplarily shown in FIG. 3a, the structural stiffening element 26 may formed as grid pattern.

As exemplarily shown in the schematic cross-sectional view of FIG. 6b, the structural stiffening element 26 may be optionally covered with the passivation layer 24. According to a further embodiment, the structural stiffening element 26 may be at least partially exposed or completely exposed (uncovered except for the contact region with the passivation layer 24), wherein the structural stiffening element 26 may be arranged on passivation layer 24.

In the following, embodiments and technical aspects of the present disclosure are described and summarized which may be used alone or in combination with the features and functionalities described herein.

The piezo-transducer 10 comprises a first portion 20-1 (which generates an electrical signal in response to a mechanical stress) and a second portion 20-2 (which only contributes to the propagation of the mechanical stress to the first portion). The first portion 20-1 (signal generating) comprises a layer stack having at least one piezo-layer 22 for generating the electric signal Sour in response to the mechanical stress and a passivation layer 24. The second portion 20-2 (only mechanical transfer) comprises the passivation layer 24 (e.g., same as the passivation layer of the first portion).

The second portion 20-2 may comprise structural elements 26 (ribs and/or holes and/or flaps) on or below the passivation layer 24 to provide more rigidity for the second portion 20-2. The structural element 26 may include ribs 26-1, which may be formed in the same process step as the piezo layer 22 on the first portion 20-1, but the ribs 26-1 do not contribute to the signal Sour because they are not connected to the first portion 20-1.

The second portion 20-2 may comprise additional layers. Thus, the mechanical part of the transducer 10 may comprise additional layers. The second portion 20-2 may comprise structural elements 26 in form of additional layers in the mechanical part 20-2 of the transducer 10. The transducer 10 may be implemented as a beam piezoelectric transducer or a plate or membrane piezoelectric transducer.

The described embodiments provide a piezoelectric transducer 10 with a low weight of deflectable structure 20 while maintaining necessary mechanical stiffness and robustness by lightweight layer stacks that may be combined with additional ridge structures 26 that have a low area coverage and thus do not heavily impact on the final weight of the mechanical structure.

Embodiments of the piezoelectric transducer 10 may include piezoelectric MEMS transducers exploiting a corrugated piezoelectric transduction area (e.g., a corrugated PMIC) as this is an additional measure to keep the MEMS at low weight and high resonance frequency. Embodiments of the piezoelectric transducer 10 may also include designs based on bending beams.

Embodiments of the piezoelectric transducer 10 may be used applications for piezoelectric microphones, piezoelectric micro speakers, differential pressure sensors, LIDAR systems, etc.

Additional embodiments and aspects are described which may be used alone or in combination with the features and functionalities described herein.

According to an embodiment, a piezoelectric transducer comprises a deflectable structure having a first portion and a laterally adjoining second portion, wherein the first portion has a piezoelectric layer and the second portion has an insulating material layer, and wherein the second portion is arranged to have a higher rigidity and a smaller mass per unit area than the first portion.

According to an embodiment, the deflectable structure comprises a deflectable membrane structure which extends from a clamped border region to a center point of the deflectable membrane structure, and wherein the first portion adjoins the clamped border region and the second region is arranged between the first region and the center point.

According to an embodiment, the first portion is arranged to form between 50 and 95% of the deflectable membrane structure.

According to an embodiment, the deflectable structure comprises a deflectable cantilevered structure which extends from a clamped border region to an end region of the deflectable cantilevered structure, and wherein the first portion adjoins the clamped border region and the second region is arranged between the first region and the end region of the deflectable cantilevered structure.

According to an embodiment, the first portion arranged to form between 40 and 60% of the deflectable cantilevered structure.

According to an embodiment, the first portion comprises at least one corrugation with a corrugated piezoelectric transducing layer.

According to an embodiment, the piezoelectric layer of the first portion is arranged to provide an electrical output signal in response to a deflection of the deflectable structure.

According to an embodiment, the piezoelectric layer of the first portion is arranged to provide the electrical output signal in response to a mechanical stress in the piezoelectric layer signal based on the deflection of the deflectable structure.

According to an embodiment, wherein the piezoelectric layer of the first portion is arranged to provide a deflection of the deflectable structure in response to an electrical input signal.

According to an embodiment, the second portion of the deflectable structure comprises a structural stiffening element for increasing the rigidity of the second portion when compared to the first portion of the deflectable structure.

According to an embodiment, the structural element comprises at least one of a rib, a ridge, a hole, a flap and an additional stiffening layer.

According to an embodiment, the structural element comprises at least one of a piezoelectric material and an insulating material.

According to an embodiment, only the first portion comprises the piezoelectric layer.

According to an embodiment, the first portion comprises a layer stack having the piezoelectric layer for generating the electrical output signal and an insulating material layer.

According to an embodiment, the first and second portion comprise the same insulating material layer.

According to an embodiment, only the second portion comprises the insulating material layer.

According to an embodiment, the second portion comprises only the insulating material layer.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

Depending on certain implementation requirements, embodiments of the control circuitry can be implemented in hardware or in software or at least partially in hardware or at least partially in software. Generally, embodiments of the control circuitry can be implemented as a computer program product with a program code, the program code being operative for performing one of the methods when the computer program product runs on a computer. The program code may for example be stored on a machine readable carrier.

In the foregoing detailed description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject matter may lie in less than all features of a single disclosed example. Thus, the following claims are hereby incorporated into the detailed description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

What is claimed is:

1. A piezoelectric transducer comprising:
a deflectable structure comprising a first portion and a second portion laterally directly adjoining the first portion,
wherein the first portion has a piezoelectric layer and the second portion comprises a first insulating material layer, and
wherein the second portion has a higher rigidity and a smaller mass per unit area than the first portion.

2. The piezoelectric transducer of claim 1, wherein:
the deflectable structure comprises a deflectable membrane structure which extends from a clamped border region to a center point of the deflectable membrane structure;
the first portion adjoins the clamped border region; and
the second portion is arranged between the first portion and the center point.

3. The piezoelectric transducer of claim 2, wherein the first portion comprises between 50% and 95% of the deflectable membrane structure.

4. The piezoelectric transducer of claim 1, wherein:
the deflectable structure comprises a deflectable cantilevered structure extending from a clamped border region to an end region of the deflectable cantilevered structure;
the first portion adjoins the clamped border region; and
the second portion is arranged between the first portion and the end region of the deflectable cantilevered structure.

5. The piezoelectric transducer of claim 4, wherein the first portion is arranged to form between 40 and 60% of the deflectable cantilevered structure.

6. The piezoelectric transducer of claim 1, wherein the first portion comprises at least one corrugation with a corrugated piezoelectric transducing layer.

7. The piezoelectric transducer of claim 1, wherein the piezoelectric layer of the first portion is configured to provide an electrical output signal in response to a deflection of the deflectable structure.

8. The piezoelectric transducer of claim 7, wherein the piezoelectric layer of the first portion is configured to provide the electrical output signal in response to a mechanical stress in the piezoelectric layer based on the deflection of the deflectable structure.

9. The piezoelectric transducer of claim 1, wherein the piezoelectric layer of the first portion is arranged to provide a deflection of the deflectable structure in response to an electrical input signal.

10. The piezoelectric transducer of claim 1, wherein the second portion of the deflectable structure comprises a structural stiffening element for increasing a rigidity of the second portion relative to the first portion of the deflectable structure.

11. The piezoelectric transducer of claim 10, wherein the structural stiffening element comprises at least one of a rib, a ridge, a hole, a flap or an additional stiffening layer.

12. The piezoelectric transducer of claim 10, wherein the structural stiffening element comprises a piezoelectric material or an insulating material.

13. The piezoelectric transducer of claim 1, wherein only the first portion comprises the piezoelectric layer.

14. The piezoelectric transducer of claim 1, wherein the first portion comprises:
a layer stack having the piezoelectric layer for generating an electrical output signal; and
a second insulating material layer.

15. The piezoelectric transducer of claim 14, wherein the first portion and the second portion comprise the same insulating material layer.

16. The piezoelectric transducer of claim 14, wherein the second portion comprises only the first insulating material layer.

17. A piezoelectric transducer comprising:
a deflectable cantilevered structure comprising:
a piezoelectric layer having a first portion disposed on a carrier structure and a second portion adjoining the first portion, wherein the second portion is suspended away from the carrier structure, and
an insulating material layer adjoining the second portion and extending to an end of the insulating material layer, wherein the insulating material layer is suspended away from the carrier structure and has a higher rigidity and a smaller mass per unit area than the second portion of the piezoelectric layer.

18. The piezoelectric transducer of claim 17,
wherein the piezoelectric layer comprises a passivation material disposed on a piezoelectric material, and
wherein the insulating material layer comprises the passivation material extending laterally from the piezoelectric layer.

19. A piezoelectric transducer comprising:
a deflectable structure comprising a first portion and a second portion laterally adjoining the first portion,
wherein the first portion has a piezoelectric layer and the second portion comprises a first insulating material layer,
wherein the second portion has a higher rigidity and a smaller mass per unit area than the first portion,
wherein the first portion comprises:
    a layer stack having the piezoelectric layer for generating an electrical output signal, and
    a second insulating material layer, and
wherein the second portion comprises only the first insulating material layer.

20. A piezoelectric transducer comprising:
a deflectable structure comprising a first portion and a second portion laterally adjoining the first portion,
wherein the first portion has a piezoelectric layer and the second portion comprises a first insulating material layer,
wherein the second portion has a higher rigidity and a smaller mass per unit area than the first portion,
wherein the first portion comprises:
    a layer stack having the piezoelectric layer for generating an electrical output signal, and
    a second insulating material layer, and
wherein only the second portion comprises the first insulating material layer.

* * * * *